United States Patent
Yang et al.

(10) Patent No.: US 11,502,137 B2
(45) Date of Patent: Nov. 15, 2022

(54) DISPLAY SUBSTRATE, ORGANIC LIGHT EMITTING DEVICE AND DISPLAY DEVICE WITH VAPOR-DEPOSITED ORGANIC FILM LAYERS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Fan Yang, Beijing (CN); Zailong Mo, Beijing (CN)

(73) Assignees: Chengdu BOE Optoelectronics Technology Co., Ltd., Sichuan (CN); Beijing BOE Technology Development Co., Ltd., Beijing (CN)

(*) Notice: Subject to any disclaimer, the term of this patent is extended or adjusted under 35 U.S.C. 154(b) by 809 days.

(21) Appl. No.: 16/333,042

(22) PCT Filed: Aug. 7, 2018

(86) PCT No.: PCT/CN2018/099160
§ 371 (c)(1),
(2) Date: Mar. 13, 2019

(87) PCT Pub. No.: WO2019/095734
PCT Pub. Date: May 23, 2019

(65) Prior Publication Data
US 2021/0351249 A1    Nov. 11, 2021

(30) Foreign Application Priority Data
Nov. 15, 2017    (CN) .......................... 201711130276.1

(51) Int. Cl.
*H01L 27/32*    (2006.01)
*H01L 21/66*    (2006.01)
(Continued)

(52) U.S. Cl.
CPC .......... *H01L 27/3223* (2013.01); *H01L 22/12* (2013.01); *H01L 27/3246* (2013.01);
(Continued)

(58) Field of Classification Search
CPC ................. H01L 2223/54426; H01L 23/544
See application file for complete search history.

(56) References Cited

U.S. PATENT DOCUMENTS

2009/0091701 A1* 4/2009 Kondo .................. G02F 1/1339
349/153
2017/0194563 A1  7/2017 Li
2018/0040857 A1* 2/2018 Hong .................. H01L 27/3223

FOREIGN PATENT DOCUMENTS

CN    105549320 A    5/2016
CN    107153492 A    9/2017
(Continued)

OTHER PUBLICATIONS

International Search Report; Application No. PCT/CN2018/099160; dated Oct. 17, 2018; English Translation Attached.

*Primary Examiner* — Jay C Chang
*Assistant Examiner* — Mikka Liu
(74) *Attorney, Agent, or Firm* — Nath, Goldberg & Meyer; Joshua B. Goldberg

(57) ABSTRACT

Disclosed is a display substrate, comprising a display area and a non-display area surrounding the display area. At least one limit mark group is disposed in the non-display area; the display area has a plurality of sides, and rounded chamfers are formed between adjacent two sides; the non-display area includes a frame part opposite to the sides of the display area and corner parts opposite to the rounded chamfers; and the limit mark group is located at the corner part. Accordingly, the disclosure also provides an organic light emitting device, a film vapor-deposition detecting method of an organic light emitting device, and a display device. According to the
(Continued)

disclosure, it is possible to reduce the display defect and the accuracy of film vapor-deposition detection.

13 Claims, 4 Drawing Sheets

(51) Int. Cl.
    *H01L 51/52*     (2006.01)
    *H01L 51/00*     (2006.01)

(52) U.S. Cl.
    CPC ...... *H01L 27/3283* (2013.01); *H01L 51/5206* (2013.01); *H01L 51/0008* (2013.01); *H01L 2251/566* (2013.01)

(56) References Cited

FOREIGN PATENT DOCUMENTS

| | | |
|---|---|---|
| CN | 107742623 A | 2/2018 |
| JP | 2005215313 A | 8/2005 |

* cited by examiner

B-B'

US 11,502,137 B2

DISPLAY SUBSTRATE, ORGANIC LIGHT EMITTING DEVICE AND DISPLAY DEVICE WITH VAPOR-DEPOSITED ORGANIC FILM LAYERS

This application is entering the national phase of PCT Application No. PCT/CN2018/099160 filed on Aug. 7, 2018, titled "DISPLAY SUBSTRATE, ORGANIC LIGHT EMITTING DEVICE, FILM VAPOR-DEPOSITION DETECTING METHOD OF ORGANIC LIGHT EMITTING DEVICE, AND DISPLAY DEVICE" and claims the benefit of Chinese Patent Application No. 201711130276.1 filed on Nov. 15, 2017 in the Chinese Intellectual Property Office, the disclosures of which are incorporated herein by reference in their entirety.

FIELD OF THE INVENTION

The present disclosure relates to, but is not limited to, the field of display technologies, and in particular, to a display substrate, an organic light emitting device, a film vapor-deposition detecting method of an organic light emitting device, and a display device.

BACKGROUND

A light emitting unit is disposed in each of the pixel regions of the Organic Light-Emitting Device (OLED) display device. The light emitting unit includes a plurality of organic film layers which are formed by a vapor deposition process. In order to detect whether or not the vapor deposition position of each organic film layer is shifted, an alignment region is usually provided outside the display area. FIG. 1 is a schematic diagram showing a first arrangement position of an alignment region in the related art, wherein the alignment region 20 is disposed on a display substrate and located on both sides of a display area 11; FIG. 2 is a schematic diagram showing a second arrangement position of the alignment region in the related art, wherein the alignment region 20 is disposed on a vacant area between adjacent two display substrate areas 10a on a motherboard; FIG. 3 is a schematic diagram showing a structure of the alignment region. As shown in FIG. 3, a plurality of limit marks 21 are disposed in the alignment region 20, and the plurality of limit marks 21 can define centers of theoretical vapor deposition zones 22. While each of organic film layers is vapor-deposited into the display area, an alignment pattern corresponding to each of the organic film layers is vapor-deposited to the alignment region. The alignment state of the alignment pattern with the theoretical vapor deposition position 22 is used to characterize whether or not the organic materials deposited in the display area 11 are shifted.

However, the arrangement of FIG. 1 may cause displaying effect to be deteriorated. The arrangement of FIG. 2 may cause the subsequent alignment pattern not to accurately characterize the alignment state of the organic film layer in the display area, and not to detect the alignment state of the organic film layer in the display area after the motherboard is sliced into a separate display substrate.

SUMMARY

The present disclosure is directed to at least one of the technical problems existing in the related art, and provides a display substrate, an organic light emitting device, a film vapor-deposition detecting method of an organic light emitting device, and a display device to more accurately detect the alignment of the organic film layer in the display area to reduce the display defect.

In order to solve the above problems, the present disclosure provides a display substrate including a display area and a non-display area surrounding the display area, wherein at least one limit mark group is disposed in the non-display area, the display area has a plurality of sides and rounded chamfers are formed between adjacent two sides, the non-display area includes a frame part opposite to the sides of the display area and corner parts opposite to the rounded chamfers, and the limit mark group is located at the corner part.

In an optional embodiment, each limit mark group includes a plurality of limit marks, and the plurality of limit marks in each limit mark group are configured to define positions of theoretical vapor deposition zones; and for any one of the limit mark groups, the theoretical vapor deposition zones defined by the plurality of limit marks are arranged in an array.

In an optional embodiment, for any one of the limit mark groups, the limit marks and the theoretical vapor deposition zones enclose an alignment region, and sizes of the alignment region in a length direction and in a width direction of the display area range from 100 μm to 130 μm.

In an optional embodiment, the limit mark is in a strip shape, and for any one of the limit mark groups, the plurality of limit marks include at least two first limit marks and two second limit marks, wherein the first limit mark extends in a first direction, the second limit mark extends in a second direction crossing the first direction; two the first limit marks are arranged in the second direction, the two second limit marks are arranged in the first direction, and the two second limit marks are located on both sides of a central connecting line of the two first limit marks.

In an optional embodiment, the plurality of limit marks in the limit mark group further includes a third limit mark, the third limit mark being strip-shaped and extending in the second direction, and the third limit mark intersects one of the first limit marks.

In an optional embodiment, the display area is provided with a pixel defining layer, the pixel defining layer is provided with a plurality of pixel openings, and the display area is further provided with an electrode corresponding to the pixel opening; the non-display area is provided with an epitaxial film layer, and the epitaxial film layer is provided with a through hole corresponding to the limit mark, and the limit mark is disposed in the through hole; and the epitaxial film layer is disposed in the same layer and formed of the same material as the electrode, and the limit mark is disposed in the same layer and formed of the same material as the pixel defining layer.

In an optional embodiment, one of the epitaxial film layer and the limit mark is transparent, and the other one is opaque.

Accordingly, the present disclosure further provides an organic light emitting device including the above display substrate, wherein the display area of the display substrate is provided with a plurality of organic film layers, and the non-display area of the display substrate is provided with an alignment pattern group corresponding to the limit mark group, the alignment pattern group being located at a corner part where the corresponding limit mark group is located.

In an optional embodiment, each limit mark group includes a plurality of limit marks, and the plurality of limit marks in each limit mark group are configured to define positions of theoretical vapor deposition zones; each alignment pattern group includes a plurality of alignment patterns, and the plurality of alignment patterns in each alignment pattern group correspond to materials of the organic film layers; and for any one of the alignment pattern groups, the plurality of alignment patterns in the alignment pattern group correspond to the theoretical vapor deposition regions defined by the limit mark group corresponding to the alignment pattern group.

Accordingly, the present disclosure also provides a display device including the above organic light emitting device.

Accordingly, the present disclosure further provides a film vapor-deposition detecting method of an organic light emitting device, comprising: providing the organic light emitting device; and determining a vapor deposition offset of the organic film layer in the display area of the display substrate in according with the limit mark group and the corresponding alignment mark group.

In an optional embodiment, the step of determining a vapor deposition offset of the organic film layer in the display area of the display substrate in according with the limit mark group and the corresponding alignment mark group includes: for each limit mark group, determining positions of theoretical vapor deposition zones in accordance with limit marks in the limit mark group; and detecting an offset of actual positions of alignment patterns with respect to the positions of the respective theoretical vapor deposition zones, and using a maximum offset of the alignment patterns corresponding to the same organic film layer as the vapor deposition offset of the organic film layer.

In an optional embodiment, the step of determining positions of theoretical vapor deposition zones in accordance with limit marks in the limit mark group includes the following steps performed in each of the alignment regions: obtaining a center position of each of the limit marks; and obtaining positions of a plurality of intersection points, wherein the plurality of intersection points include intersection points formed by two first straight lines extending along a first direction and two second straight lines extending along a second direction and an intersection point of a central connecting line of the two first limit marks and a central connecting line of the two second limit marks, and using the positions of the plurality of intersection points as the positions of theoretical vapor deposition zones, respectively, wherein the two first straight lines pass through centers of the two first limit marks, respectively, and the two second straight lines pass through centers of the two second limit marks, respectively, and the step of detecting an offset of actual positions of alignment patterns with respect to the positions of the respective theoretical vapor deposition zones and using a maximum offset of the alignment patterns corresponding to the same organic film layer as the vapor deposition offset of the organic film layer includes: obtaining a center position of each of the alignment patterns; and calculating an offset between the center position of each of the alignment patterns and the position of the respective theoretical vapor deposition zone.

In an optional embodiment, the non-display area is provided with an epitaxial film layer, the epitaxial film layer is provided with a through hole corresponding to the limit mark, the limit mark is disposed in the through hole, the electrode is opaque, and the second film layer is transparent, the step of obtaining a center position of each of the limit marks includes: providing a first light source and a first light collecting member on both sides of the organic light emitting device, respectively, wherein light of the first light source passes through the epitaxial film layer and the alignment patterns and collected by the first light collecting member; and determining edge positions of the limit marks according to the light collected by the first light collecting member, and calculating center positions of the respective limit marks according to the edge positions of the limit marks, the step of obtaining a center position of each of the alignment patterns includes: providing a second light source on the same side of the first light collecting member, and providing a second light collecting member on the same side of the first light source, wherein the second light source is configured to excite the alignment patterns to emit light and the second light collecting member is configured to collect the light emitted by the alignment patterns; and determining edge positions of the alignment patterns according to the light collected by the second light collecting member, and calculating center positions of the respective alignment patterns according to the edge positions of the alignment patterns.

According to the embodiments of the present disclosure, the rounded chamfer of the display area is arranged such that the width of the corner part of the non-display area is greater than the width of the frame part. Therefore, when the limit mark group is placed at the corner part having a large space, the influence of the limit mark group on the signal line can be reduced, thereby reducing display defects and improving the display effect of the organic light emitting device and the display device. In addition, according to the embodiments of the present disclosure, the limit mark group is disposed on the display substrate and is closer to the display area, such that the pixel position alignment of the display area can be detected more accurately, thereby improving the monitoring effect and further ensuring the quality of the organic light emitting device and the display device.

BRIEF DESCRIPTION OF THE DRAWINGS

The accompanying drawings are intended to provide a further understanding of the disclosure, constitute a part of the specification, and are provided to explain the disclosure together with the following specific embodiments. However, the accompanying drawings are not intended to limit the disclosure. In the drawing.

Figure 1:
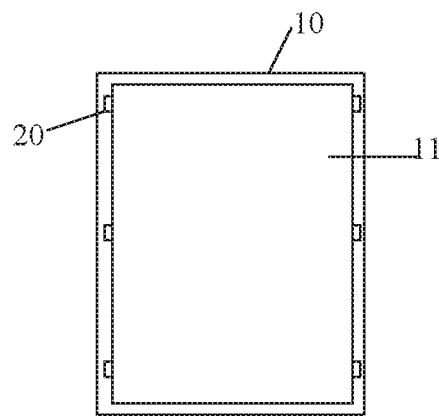
FIG. 1 is a schematic diagram showing a first arrangement position of an alignment region in the related art.

In the reference numerals:

10, display substrate; 10a, display substrate area; 11, display area; 12, non-display area; 121, frame part; 122, corner part; 20, alignment region; 21, limit mark; 211, first limit mark; 212, second limit mark; 213, third limit mark;

22, theoretical vapor deposition zone; 23, epitaxial film layer; 31-35, alignment pattern.

DETAILED DESCRIPTION OF THE EMBODIMENTS

The specific embodiments of the present disclosure will be described in detail below with reference to the accompanying drawings. It is to be understood that the specific embodiments described herein are provided for illustrative purposes and are not intended to limit the disclosure.

Figure 4:
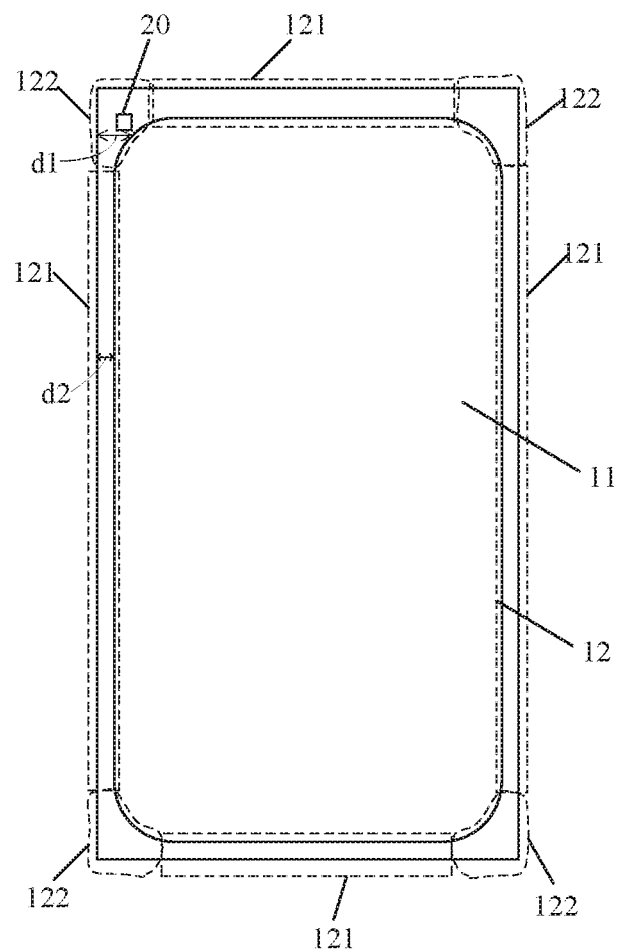
FIG. 4 is a schematic diagram of a display substrate according to an embodiment of the present disclosure.
Figure 5:
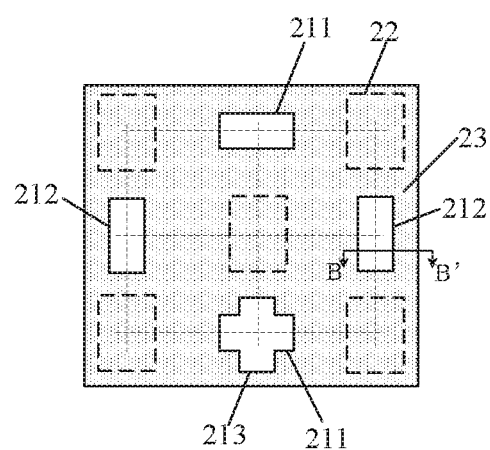
FIG. 5 is a schematic diagram showing the structure and arrangement of limit marks in the alignment region according to an embodiment of the present disclosure.

As an aspect of the present disclosure, there is provided a display substrate applicable to an organic light emitting (OLED) device. As shown in FIG. 4, the display substrate includes a display area 11 and a non-display area 12 surrounding the display area 11. The display area 11 has a plurality of sides, and rounded chamfers are formed between adjacent two sides. As shown in FIG. 4, the display area 11 is in a shape of rounded rectangle; the non-display area 12 includes a frame part 121 opposite to the sides of the display area 11 and corner parts 122 opposite to the rounded chamfers. In other words, a side of the corner part 122 facing a center of the display area 11 is formed as a curved edge. At least one limit mark group is disposed in the non-display area 12. As shown in FIG. 5, each of the limit mark groups includes a plurality of limit marks 211 to 213. The limit mark group located at the corner part 122.

In an exemplary embodiment, the display area 11 includes a plurality of pixel regions, each of the pixel regions is provided with light emitting units, and each of the light emitting units includes a plurality of organic film layers. The limit mark group can be used for the detection of Pixel Position Alignment (PPA). Here, the PPA is defined as an offset of the actual position of the organic film layer with respect to the pixel region. The specific manner of detecting the PPA by using the limit mark group is not limited herein.

Figure 2:
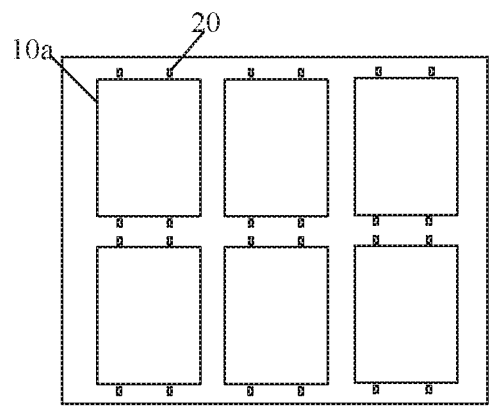
FIG. 2 is a schematic diagram showing a second arrangement position of the alignment region in the related art.
Figure 3:
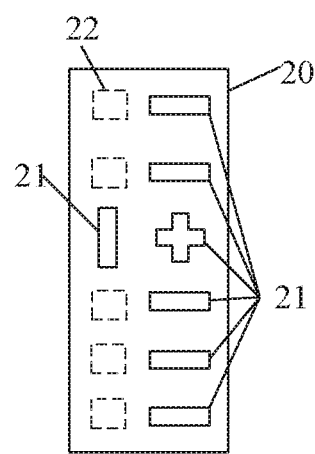
FIG. 3 is a schematic diagram showing a structure of the alignment region in FIGS. 1 and 2.

It should be understood by those skilled in the art that a signal line for sending a signal to the display area 11 is disposed in the non-display area 12. Therefore, when the limit mark group is disposed in the non-display area 12 and adjacent to the sides of the display area 11 (i.e., the example as shown in FIG. 1), the limit mark group occupies a width to a certain degree. In the case where the width of the frame is fixed, a width of wiring area has necessarily to be reduced, resulting in an increase in signal line resistance and in turn causing the uneven display. When the limit mark group is disposed in the vacant area between the adjacent two display substrate areas 10a in the motherboard (i.e., the example as shown in FIG. 2), on the one hand, after the motherboard is sliced, the limit mark group is separated from the display substrate 10 such that the PPA in the display area 11 cannot be detected; on the other hand, due to the limitation of the process conditions, the difference between the detected offset and the actual pixel offset in the display area becomes larger as the limit mark group is distanced from the display area 11. Therefore, even if the PPA in the display area 11 is detected before the motherboard is sliced, it is impossible to accurately detect the PPA.

In the display substrate of the present disclosure, the rounded chamfer of the display area 11 is disposed such that a width d1 of the corner part 122 of the non-display area 12 is greater than a width d2 of the frame part 121. Therefore, when the limit mark group is disposed in the corner part 122 having a large space, the influence of the limit mark group on the signal line can be reduced, thereby reducing display defects. In addition, compared with the arrangement of FIG. 2, the limit mark group in the display substrate of the present disclosure is disposed on the display substrate 10, which is closer to the display area 11, such that the PPA of the display area 11 can be detected more accurately, thereby improving the accuracy of the film evaporation test.

As shown in the figures of the embodiments of the present disclosure, the description is made by taking one limit mark group as an example. Of course, it can be understood that a plurality of limit mark groups can also be provided. In an optional embodiment, each corner part 122 is provided with at most one limit mark group. In other words, when a plurality of limit mark groups are provided, the various limit mark groups may be located at different corner parts to prevent the limit mark groups at the corner part 122 occupying too much wiring space, thereby affecting the display effect.

Specifically, as shown in FIG. 5, each of the limit mark groups includes a plurality of limit marks 211 to 213, and the plurality of limit marks 211 to 213 in each of the limit mark groups are configured to define positions of a plurality of theoretical vapor deposition zones. For any one of the limit mark groups, the plurality of theoretical vapor deposition zones 22 defined by the limit marks are arranged in an array. In other words, the plurality of theoretical vapor deposition zones 22 are arranged in a plurality of rows and columns. The plurality of limit marks and the plurality of theoretical vapor deposition zones 22 defined thereby enclose an alignment region 20. The plurality of theoretical vapor deposition zones 22 are arranged in a plurality of rows and columns, thereby advantageously forming the alignment region 20 as a square or substantially square shape to facilitate placement of the alignment region 20 at the corner part 122.

It should be noted that the theoretical vapor deposition zone 22 refers to a region where the corresponding alignment pattern is located in the case that the organic film layer is accurately positioned when the organic film layer is accurately vapor-deposited in each pixel region of the display area 11, wherein the alignment pattern is a pattern for monitoring the PPA. Specifically, when the organic film layer (for example, the red light-emitting layer) is vapor-deposited to the display area 11, in order to monitor whether the vapor deposition position of the organic film layer is offset from the target pixel region, alignment holes and vapor deposition holes are provided on a mask. The alignment holes are configured to align with the theoretical vapor deposition zone 22, the vapor deposition holes are configured to align with the pixel regions of the organic film layer to be evaporated, and the relative position between the alignment hole and the respective vapor deposition hole is the same to the relative position between the theoretical vapor deposition region 22 and the pixel region of each of the organic film layers to be evaporated. In this manner, when the organic material is vapor-deposited through the alignment holes onto the theoretical vapor deposition zone 22 to form an alignment pattern, the organic material that has passed through the vapor deposition holes can be accurately formed in the pixel region of the organic material to be evaporated. Thus, the offset of the corresponding organic film layer in the pixel region (i.e., the above-described PPA) in the display area 11 can be represented by the offset between each of the alignment patterns and the theoretical vapor deposition region 22. The disclosure is not limited as to how to define positions of the theoretical vapor deposition zones 22 using the limit marks. For example, in the case that the limit marks are in a strip shape, an intersection position of straight lines where two limit marks would be intersected in their extending directions could be a theoretical position of the alignment pattern.

At present, the alignment region 20 in FIG. 1 has a large area (usually around 30,000 μm²), thereby occupying more wiring space. In contrast, if the alignment region 20 has a relatively small size, the plurality of theoretical vapor deposition zones 22 would be closer to each other. Thus, after the alignment pattern is formed, it is difficult to identify the boundary of the alignment pattern, thereby affecting the monitoring effect. For this reason, according to this embodiment of the present disclosure, the dimensions of the alignment region 20 in a longitudinal direction and in a width direction of the display area 11 are both from 100 μm to 130 μm, such that the occupied space at the corner part 122 can be reduced while the boundary of the alignment pattern can be clearly identified. Specifically, the size of the alignment region 20 in the longitudinal direction of the display area 11 (a vertical direction in FIGS. 4 and 5) is 108.38 μm, and the size thereof in the width direction of the display area 11 (a horizontal direction in FIGS. 4 and 5) is 113 μm. In this embodiment of the present disclosure, the area of the alignment region 20 is about 12000 μm², which is significantly smaller than the area of the alignment region 20 in the related art. Therefore, in this embodiment, the alignment region 20 is more easily disposed at the corner part 122, thereby reducing the occupation of the wiring space and reducing the influence on the signal line.

The structure and arrangement of the limit marks in the limit mark group are as shown in FIG. 5, wherein the limit marks are in a strip shape. For any one of the limit mark groups, the plurality of limit marks in the limit mark group include at least two first limit marks 211 and two second limit marks 212. The first limit mark 211 extends in a first direction, and the second limit mark 212 extends in a second direction crossing the first direction. The two first limit marks 211 are arranged in the second direction, the two second limit marks 212 are arranged in the first direction, and the two second limit marks 212 are located on both sides of a central connecting line of the two first limit marks 211, respectively.

Specifically, the first direction is perpendicular to the second direction to concentrate the limit marks and the theoretical vapor deposition zones 22. In FIG. 5, for example, the first direction is the horizontal direction and the second direction is the vertical direction. A straight line passing through the center of a limit mark and extending along the extension direction of the limit mark is regarded as a center line of the limit mark. Then, an intersection of a center line of the second limit mark 212 on a left side and a center line of the upper first limit mark 211 is a center of the theoretical vapor deposition zone 22 at the upper left corner, thereby defining the position of the theoretical vapor deposition zone 22 at the upper left corner; likewise, an intersection of a centerline of the second limit mark 212 on a left side and a centerline of the lower first limit mark 211 is the position of the theoretical vapor deposition zone 22 at the lower left corner; an intersection of a center line of the second limit mark 212 on the right side and a centerline of the upper first limit mark 211 is the position of the theoretical vapor deposition zone 22 at the upper right corner; an intersection of a center line of the second limit mark 212 on the right side and a center line of the lower first limit mark 211 is a center of the theoretical vapor deposition zone 22 at lower right corner; and an intersection of the central connecting line of the two first limit marks 211 and the central connecting line of the two second limit marks 212 is a center of the intermediate theoretical vapor deposition zone 22.

Further, the limit marks in the limit mark group may further include a third limit mark 213. The third limit mark 213 is strip-shaped and extends in the second direction, and the third limit mark 213 intersects one of the first limit marks 211 to form a cross structure. As such, the position of the intermediate theoretical vapor deposition zone 22 can be determined by the two first limit marks 211 and the two second limit marks 212, or by the two second limit marks 212 and the third limit mark 213.

Figure 6:
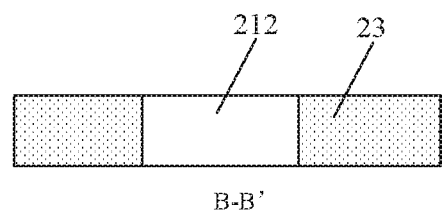
FIG. 6 is a cross-sectional diagram taken along a line B-B' in FIG. 5.

Further, the display area 11 is provided with a pixel defining layer and a plurality of electrodes. A plurality of pixel openings are arranged on the pixel defining layer, and the electrodes corresponds to the respective pixel openings. The pixel openings are for accommodating respective organic film layers of the organic light emitting unit. It can be understood that the electrodes are lower electrodes of the respective light-emitting units, i.e., anodes. The offset of the organic film layer in the pixel region is an offset of the organic film layer with respect to the pixel openings. As shown in FIGS. 5 and 6, the non-display area is provided with an epitaxial film layer 23, and the epitaxial film layer 23 is provided with through holes corresponding to the limit marks 211 to 213, respectively. The limit marks 211 to 213 are disposed in the through holes. The epitaxial film layer 23 is disposed in the same layer and formed of the same material as the electrodes. The limit marks 211 to 213 are disposed in the same layer and formed of the same material as the pixel defining layer. In other words, the same material as the pixel defining layer is filled in the through hole as the limit marks 211 to 213. It should be understood that terms "the same layer" and "the same material" mean that the two components can be fabricated in one step using the same process. In the manufacturing process of the display substrate, the pixel defining layer is formed synchronously with the limit marks 211 to 213 and the epitaxial film layer is formed synchronously with the electrodes, thereby simplifying the structure and the manufacturing process.

In one embodiment, one of the epitaxial film layer 23 and the limit mark is transparent while the other is opaque. In this manner, when the image of the limit mark and the alignment pattern is subsequently captured to detect the PPA, white light can be provided on one side of the display substrate and excitation light for exciting the alignment pattern can be provided on the other side. In this manner, the image of the limit mark and the alignment pattern can be separately collected by the two light capturing lenses, thereby improving the measurement accuracy. The specific method of image acquisition will be introduced hereinafter, and omitted here.

In an exemplary embodiment, the epitaxial film layer 23 is opaque, and the limit marks 211 to 213 are transparent. The material of the epitaxial film layer 23 (i.e., the material of the electrode) may include a reflective material such as a al such that the light emitting unit of the display area 11 forms a top light emitting structure. The material of the limit marks 211 to 213 may include silicon oxide and/or silicon nitride or the like. Since the wet etching process used in patterning the metal film layer generates some water vapor, the bulging of the epitaxial film layer 23 may occur when the electrode and the epitaxial film layer are simultaneously formed. In contrast, in the present disclosure, the forming of a trough hole on the epitaxial film layer 23 can reduce the bulge, and filling of the same material as the pixel defining layer in the through hole can prevent the edge of the through hole from being burred due to oxidation. Therefore, it is advantageous to perform edge detection on the limit marks 211 to 213.

As another aspect of the present disclosure, there is provided an organic light emitting device including the above display substrate 10. The display area 11 of the display substrate 10 is provided with a plurality of organic film layers, and the various organic film layers may be located in different layers. Specifically, the display area 11 includes a plurality of pixel regions, each of which is provided with a light emitting unit, and the colors of the light emitting units may be divided into red, green, and blue. The organic film layers are a plurality of film layers of the light emitting unit. For example, the organic film layers may include a red light emitting layer of each red light emitting unit, a green light emitting layer of each green light emitting unit, a blue light emitting layer of each blue light emitting unit, an electron injection layer of each light emitting unit, and the like. The non-display area of the display substrate 10 is provided with an alignment pattern group corresponding to the limit mark group, and the alignment pattern group is located at a corner part where the corresponding limit mark group is located. The alignment pattern group and the limit marker group are used together to detect the PPA.

Figure 7:
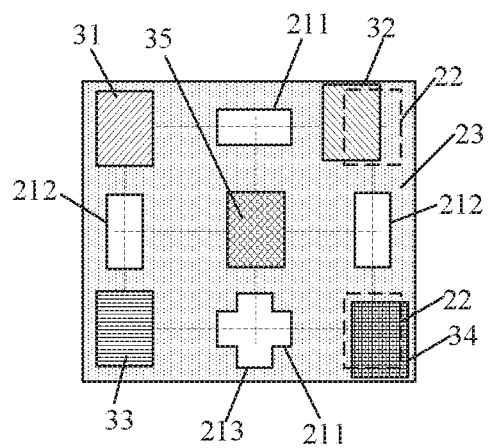
FIG. 7 is a schematic diagram of an alignment region in which an alignment pattern is formed.
Figure 8:
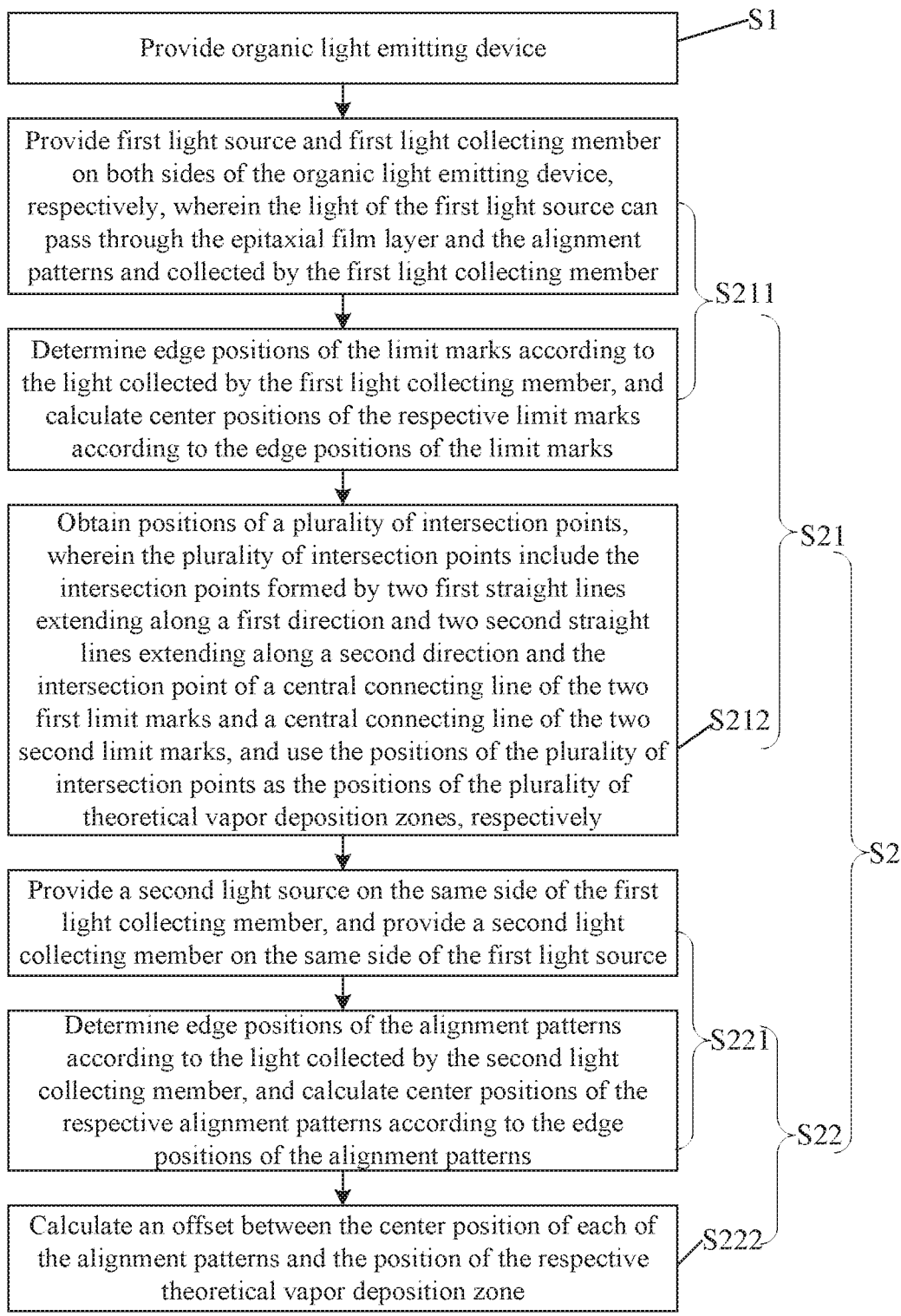
FIG. 8 is a flow chart of a film layer vapor-deposition detecting method according to an embodiment of the present disclosure.

In an exemplary embodiment, the limit mark group includes a plurality of limit marks for defining the positions of the plurality of theoretical vapor deposition zones 22, Each of the alignment pattern groups includes a plurality of alignment patterns (the alignment patterns 31 to 35 in FIG. 7), and the plurality of alignment patterns 31 to 35 of each of the alignment pattern groups correspond to the materials of the respective organic film layers. For any one of the alignment pattern groups, the plurality of alignment patterns in the alignment pattern group correspond to the respective theoretical vapor deposition regions 22 defined by the limit mark group corresponding to the alignment pattern group. In other words, in the alignment region 20, the positions of the theoretical vapor deposition zones 22 defined by the plurality of limit mark groups are positions of theory regions of the alignment patterns corresponding to the alignment region 20, respectively. While vapor-depositing various organic film layers on the display substrate, the corresponding alignment patterns 31 to 35 are also vapor-deposited to the alignment region 20, and the offset of the actual vapor deposition positions of the alignment patterns 31 to 35 with respect to the positions of the theoretical vapor deposition regions 22 indicates an offset of the corresponding organic film layer with respect to the pixel region. As shown in FIG. 7, the alignment pattern 31, the alignment pattern 33, and the alignment pattern 35 are aligned with the respective theoretical vapor deposition regions 22, indicating the organic film layer corresponding to the alignment pattern 31 in the display area 11, the organic film layer corresponding to the alignment pattern 33 and the organic film layer corresponding to the alignment pattern 35 are not shifted during vapor deposition; the offset between the alignment pattern 32 and the theoretical vapor deposition region 22 at the upper right corner indicates an offset of the corresponding organic film layer in the pixel region; the offset between the alignment pattern 34 and the theoretical vapor deposition region 22 at the lower right corner indicates an offset of the organic film layer corresponding to the alignment pattern 34 in the pixel region.

As still another aspect of the present disclosure there is provided a display device including the above organic light emitting device. The display device may be a product or component having a display function such as a mobile phone, a tablet computer, a display, a television, or the like. Since the placement of the limit mark group in the display substrate can reduce the influence on the signal line and facilitate the detection of the PPA, the organic light-emitting device and the display device using the display substrate can have an improved display effect and can conveniently and accurately detect the vapor deposition effect of the film layer.

As a further aspect of the present disclosure, a film vapor-deposition detecting method of an organic light emitting device is provided. As shown in FIG. 4 to FIG. 8, the vapor-deposition detecting method includes:

S1, providing an organic light emitting device; and

S2: determining a vapor deposition offset (i.e., the above PPA) of the organic film layer in the display area of the display substrate in according with the limit mark group and the corresponding alignment mark group.

As described above, each of the limit mark groups includes a plurality of limit marks for defining positions of a plurality of theoretical vapor deposition zones, each of the alignment pattern groups includes a plurality of alignment patterns, and the alignment patterns in each of the plurality of alignment pattern groups corresponds to the materials of the respective organic film layers; the plurality of alignment patterns in the alignment pattern group corresponds to the plurality of theoretical vapor deposition regions defined by the respective limit mark groups. Step S2 specifically includes:

S21, for each limit mark group, determining positions of theoretical vapor deposition zones 22 in accordance with limit marks in the limit mark group; and S22, detecting an offset of actual positions of alignment patterns 31-35 with respect to the positions of the respective theoretical vapor deposition zones 22, and using a maximum offset of the alignment patterns corresponding to the same organic film layer as the vapor deposition offset of the organic film layer (i.e., the above PPA).

The organic light emitting device may have one alignment region 20 or more than one alignment region 20. In the embodiments of the present disclosure, one alignment region 20 will be taken as an example for description. In this case, there may be one alignment pattern group, such that the vapor deposition offset of each organic film layer is the offset of the alignment pattern corresponding to the organic film layer.

As mentioned above, the limit marks are in a strip shape. The plurality of limit marks in each limit mark group includes at least two first limit marks 211 and two second limit marks 212. The first limit mark 211 extends in the first direction, and the second limit mark 212 extends in the second direction. The non-display area of the display substrate 10 is provided with an epitaxial film layer 23. The epitaxial film layer 23 is provided with through holes corresponding to the limit marks 211 to 213, respectively. The limit marks 211 to 213 are disposed in the through holes. The epitaxial film layer 23 is opaque while the limit marks 211 to 213 are transparent. In this case, the step S21 specifically includes following steps S211 and S212 performed in each of the alignment regions 20.

S211, obtaining a center position of each of the limit marks 211 to 213. Specifically, the step S211 includes: providing a first light source and a first light collecting member on both sides of the organic light emitting device, respectively, wherein the light of the first light source can pass through the epitaxial film layer 23 and the alignment patterns 31 to 35 and collected by the first light collecting member; subsequently, determining edge positions of the limit marks 211 to 213 according to the light collected by the first light collecting member, and calculating center positions of the respective limit marks 211 to 213 according to the edge positions of the limit marks 211 to 213. Specifically, the first light source may be disposed on a side of the display substrate 10 facing away from the organic film layer, and the first light collecting member is disposed on a side of the display substrate 10 where the organic film layer is disposed; the first light source is specifically a white light source, and the first light collecting member can obtain images of the limit marks 211 to 213 according to the collected light and detect the boundaries of the limit marks 211 to 213 by image gray scale recognition.

S212. obtaining positions of a plurality of intersection points, wherein the plurality of intersection points include the intersection points formed by two first straight lines extending along a first direction and two second straight lines extending along a second direction and the intersection point of a central connecting line of the two first limit marks 211 and a central connecting line of the two second limit marks 212, and using the positions of the plurality of intersection points as the positions of the plurality of theoretical vapor deposition zones 22, respectively, wherein the two first straight lines pass through centers of the two first limit marks 211, respectively, and the two second straight lines pass through centers of the two second limit marks 212, respectively.

The above step S22 specifically includes the following steps S221 and S222.

S221, obtaining a center position of each of the alignment patterns 31 to 35. The step S221 specifically includes: providing a second light source on the same side of the first light collecting member, and providing a second light collecting member on the same side of the first light source, wherein the second light source is configured to excite the alignment patterns 31 to 35 to emit light and the second light collecting member is configured to collect the light emitted by the alignment patterns 31 to 35; subsequently, determining edge positions of the alignment patterns 31 to 35 according to the light collected by the second light collecting member, and calculating center positions of the respective alignment patterns 31 to 35 according to the edge positions of the alignment patterns 31 to 35. In an embodiment, the second light source may be an ultraviolet light source, and similar to the first light collecting member, and the second light collecting member can obtain the images of the alignment patterns 31 to 35 according to the collected light and detect the boundaries of the alignment patterns 31 to 35 by the image gray scale recognition.

S222, calculating an offset between the center position of each of the alignment patterns 31 to 35 and the position of the respective theoretical vapor deposition zone 22 (i.e., the intersection point obtained in step S212).

According to the embodiment of the present disclosure, when the center of the alignment pattern and the center of the limit mark are obtained, wavelengths of the light emitted by the first light source and the second light source are different, the first light source and the second light source are located on different sides of the organic light emitting device, respectively, and the first light collecting member and the second light collecting member may also be located on different sides of the organic light emitting device. As such, the imaging of the alignment pattern and the limit mark can be prevented from interfering with each other, thereby improving the detection accuracy.

It is to be understood that the above embodiments are merely exemplary embodiments employed to explain the principles of the present disclosure, but the present disclosure is not limited thereto. Various modifications and improvements can be made by those skilled in the art without departing from the spirit and scope of the disclosure, and such modifications and improvements are also considered to be within the scope of the disclosure.

The invention claimed is:

1. A display substrate comprising a display area and a non-display area surrounding the display area, wherein
at least one limit mark group is disposed in the non-display area, wherein each limit mark group includes a plurality of limit marks, and the plurality of limit marks in each limit mark group are configured to define positions of theoretical vapor deposition zones, and for any one of the limit mark groups, the theoretical vapor deposition zones defined by the plurality of limit marks are arranged in an array,
the display area has a plurality of sides, and rounded chamfers are formed between adjacent two sides of the display area,
the non-display area includes a frame part opposite to the sides of the display area and corner parts opposite to the rounded chamfers, and
the limit mark group is located at the corner part.

2. The display substrate according to claim 1, wherein for any one of the limit mark groups, the limit marks and the theoretical vapor deposition zones enclose an alignment region, and sizes of the alignment region in a length direction and in a width direction of the display area range from 100 μm to 130 μm.

3. The display substrate according to claim 1, wherein
the limit mark is in a strip shape, and
for any one of the limit mark groups, the plurality of limit marks include at least two first limit marks and two second limit marks, wherein the first limit mark extends in a first direction, the second limit mark extends in a second direction crossing the first direction; the two first limit marks are arranged in the second direction, the two second limit marks are arranged in the first direction, and the two second limit marks are located on both sides of a central connecting line of the two first limit marks.

4. The display substrate according to claim 3, wherein
the plurality of limit marks in the limit mark group further includes a third limit mark, the third limit mark being strip-shaped and extending in the second direction, and the third limit mark intersects one of the first limit marks.

5. The display substrate according to claim 1, wherein
the display area is provided with a pixel defining layer, the pixel defining layer is provided with a plurality of pixel openings, and the display area is further provided with an electrode corresponding to the pixel opening;
the non-display area is provided with an epitaxial film layer, and the epitaxial film layer is provided with a through hole corresponding to the limit mark, and the limit mark is disposed in the through hole; and
the epitaxial film layer is disposed in the same layer and formed of the same material as the electrode, and the limit mark is disposed in the same layer and formed of the same material as the pixel defining layer.

6. The display substrate according to claim 5, wherein
one of the epitaxial film layer and the limit mark is transparent, and the other one is opaque.

7. An organic light emitting device comprising a display substrate having a display area and a non-display area surrounding the display area, wherein
at least one limit mark group is disposed in the non-display area, wherein each limit mark group includes a plurality of limit marks, and the plurality of limit marks in each limit mark group are configured to define positions of theoretical vapor deposition zones, and for any one of the limit mark groups, the theoretical vapor deposition zones defined by the plurality of limit marks are arranged in an array, the display area has a plurality of sides, and rounded chamfers are formed between adjacent two sides of the display area, the non-display area includes a frame part opposite to the sides of the display area and corner parts opposite to the rounded chamfers, the limit mark group is located at the corner part, and the display area of the display substrate is provided with a plurality of organic film layers, and the non-display area of the display substrate is provided with an alignment pattern group corresponding to the limit mark group, the alignment pattern group being located at a corner part where the corresponding limit mark group is located.

8. The organic light emitting device according to claim 7, wherein each alignment pattern group includes a plurality of alignment patterns, and the plurality of alignment patterns in each alignment pattern group correspond to materials of the organic film layers; and for any one of the alignment pattern groups, the plurality of alignment patterns in the alignment pattern group correspond to the theoretical vapor deposition zones defined by the limit mark group corresponding to the alignment pattern group.

9. A film vapor-deposition detecting method of an organic light emitting device, comprising:

providing the organic light emitting device according to claim 7; and determining a vapor deposition offset of the organic film layer in the display area of the display substrate in according with the limit mark group and the corresponding alignment mark group.

10. The method according to claim 9, wherein each alignment pattern group includes a plurality of alignment patterns, and the plurality of alignment patterns in each alignment pattern group correspond to materials of the organic film layers; and for any one of the alignment pattern groups, the plurality of alignment patterns in the alignment pattern group correspond to the theoretical vapor deposition zones defined by the limit mark group corresponding to the alignment pattern group, the step of determining a vapor deposition offset of the organic film layer in the display area of the display substrate in according with the limit mark group and the corresponding alignment mark group comprises:

for each limit mark group, determining positions of theoretical vapor deposition zones in accordance with limit marks in the limit mark group; and detecting an offset of actual positions of alignment patterns with respect to the positions of the respective theoretical vapor deposition zones, and using a maximum offset of the alignment patterns corresponding to the same organic film layer as the vapor deposition offset of the organic film layer.

11. The method according to claim 10, wherein the limit mark is in a strip shape; for any one of the limit mark groups, the plurality of limit marks include at least two first limit marks and two second limit marks, wherein the first limit mark extends in a first direction, the second limit mark extends in a second direction crossing the first direction; the two first limit marks are arranged in the second direction, the two second limit marks are arranged in the first direction, and the two second limit marks are located on both sides of a central connecting line of the two first limit marks, the step of determining positions of theoretical vapor deposition zones in accordance with limit marks in the limit mark group comprises the following steps performed in each of the alignment regions:

obtaining a center position of each of the limit marks; and obtaining positions of a plurality of intersection points, wherein the plurality of intersection points include intersection points formed by two first straight lines extending along a first direction and two second straight lines extending along a second direction and an intersection point of a central connecting line of the two first limit marks and a central connecting line of the two second limit marks, and using the positions of the plurality of intersection points as the positions of theoretical vapor deposition zones, respectively, wherein the two first straight lines pass through centers of the two first limit marks, respectively, and the two second straight lines pass through centers of the two second limit marks, respectively, the step of detecting an offset of actual positions of alignment patterns with respect to the positions of the respective theoretical vapor deposition zones and using a maximum offset of the alignment patterns corresponding to the same organic film layer as the vapor deposition offset of the organic film layer comprises:

obtaining a center position of each of the alignment patterns; and calculating an offset between the center position of each of the alignment patterns and the position of the respective theoretical vapor deposition zone.

12. The method according to claim 11, wherein the non-display area is provided with an epitaxial film layer, the epitaxial film layer is provided with a through hole corresponding to the limit mark, the limit mark is disposed in the through hole, the step of obtaining a center position of each of the limit marks comprises:

providing a first light source and a first light collecting member on both sides of the organic light emitting device, respectively, wherein light of the first light source passes through the epitaxial film layer and the alignment patterns and collected by the first light collecting member; and determining edge positions of the limit marks according to the light collected by the first light collecting member, and calculating center positions of the respective limit marks according to the edge positions of the limit marks, the step of obtaining a center position of each of the alignment patterns comprises:

providing a second light source on the same side of the first light collecting member, and providing a second light collecting member on the same side of the first light source, wherein the second light source is configured to excite the alignment patterns to emit light and the second light collecting member is configured to collect the light emitted by the alignment patterns; and determining edge positions of the alignment patterns according to the light collected by the second light collecting member, and calculating center positions of the respective alignment patterns according to the edge positions of the alignment patterns.

13. A display device, comprising an organic light emitting device having a display substrate, the display substrate including a display area and a non-display area surrounding the display area, wherein
- at least one limit mark group is disposed in the non-display area, the display area has a plurality of sides, and rounded chamfers are formed between adjacent two sides of the display area, the non-display area includes a frame part opposite to the sides of the display area and corner parts opposite to the rounded chamfers, the limit mark group is located at the corner part, wherein each limit mark group includes a plurality of limit marks, and the plurality of limit marks in each limit mark group are configured to define positions of theoretical vapor deposition zones, and for any one of the limit mark groups, the theoretical vapor deposition zones defined by the plurality of limit marks are arranged in an array, and the display area of the display substrate is provided with a plurality of organic film layers, and the non-display area of the display substrate is provided with an alignment pattern group corresponding to the limit mark group, the alignment pattern group being located at a corner part where the corresponding limit mark group is located.

* * * * *